United States Patent
Mei et al.

(10) Patent No.: US 11,611,015 B2
(45) Date of Patent: Mar. 21, 2023

(54) QUANTUM DOT DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Wenhai Mei, Beijing (CN); Xiaoyuan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 352 days.

(21) Appl. No.: 16/767,900

(22) PCT Filed: Dec. 18, 2019

(86) PCT No.: PCT/CN2019/126345
§ 371 (c)(1),
(2) Date: May 28, 2020

(87) PCT Pub. No.: WO2020/140761
PCT Pub. Date: Jul. 9, 2020

(65) Prior Publication Data
US 2021/0226084 A1 Jul. 22, 2021

(30) Foreign Application Priority Data
Jan. 3, 2019 (CN) .......................... 201910005380.0

(51) Int. Cl.
*H01L 33/06* (2010.01)
*B82Y 40/00* (2011.01)
*H01L 31/0352* (2006.01)
*H01L 33/00* (2010.01)

(52) U.S. Cl.
CPC .............. *H01L 33/06* (2013.01); *B82Y 40/00* (2013.01); *H01L 31/035218* (2013.01); *H01L 33/005* (2013.01)

(58) Field of Classification Search
None
See application file for complete search history.

(56) References Cited

U.S. PATENT DOCUMENTS

| | | | |
|---|---|---|---|
| 2013/0069036 A1* | 3/2013 | Miyata | C09K 11/565 438/35 |
| 2017/0115561 A1 | 4/2017 | Yang et al. | |
| 2020/0083470 A1* | 3/2020 | Chung | C09K 11/70 |

FOREIGN PATENT DOCUMENTS

| | | |
|---|---|---|
| CN | 104021735 | 9/2014 |
| CN | 105514238 | 4/2016 |
| CN | 107799672 | 3/2018 |
| CN | 109671874 | 4/2019 |
| KR | 1020100093858 | 8/2010 |

* cited by examiner

*Primary Examiner* — Evren Seven
(74) *Attorney, Agent, or Firm* — Leason Ellis LLP

(57) ABSTRACT

Disclosed are a quantum dot display panel, a manufacturing method thereof and a display device. The manufacturing method includes: forming a first functional layer on a substrate; processing the first functional layer so that the first functional layer includes a processed region and the processed region includes ions having a first polarity; forming a quantum dot layer having a second polarity in the processed region. The second polarity and the first polarity are opposite electrical polarities.

20 Claims, 3 Drawing Sheets

---

Forming a first functional layer on a substrate

Processing the first functional layer so that the first functional layer includes a processed region and the processed region includes ions having a first polarity Forming a quantum dot layer having a second polarity in the processed region, wherein the second polarity and the first polarity are opposite electrical polarties

QUANTUM DOT DISPLAY PANEL, MANUFACTURING METHOD THEREOF, AND DISPLAY DEVICE

CROSS REFERENCE TO RELATED APPLICATIONS

This application is a U.S. National Stage Application under 35 U.S.C. § 371 of International Patent Application No. PCT/CN2019/126345, filed Dec. 18, 2019, which claims priority of the Chinese Patent Application No. 201910005380.0 filed on Jan. 3, 2019, the disclosures of which are incorporated herein by reference in their entireties as part of the present application.

TECHNICAL FIELD

Embodiments of the present disclosure relate to a quantum dot display panel, a manufacturing method thereof and a display device.

BACKGROUND

AMOLED (active-matrix organic light-emitting diode) display has been recognized as the next generation of display which is a promising alternative to liquid crystal display (LCD). With the improvement of consumption level of consumers, high-resolution display products have become the key development direction of display products. However, high-resolution organic light-emitting display such as high-resolution AMOLED display is difficult to compete with LCD due to the main reasons as follows: the organic light-emitting layer structure of the organic light-emitting display is usually prepared by a mask evaporation method, while the mask evaporation method has the defects of difficult alignment, low yield and inability to realize smaller-area light emission; due to the insufficient ability of the mask evaporation method to accurately control the evaporation region, the organic light-emitting display such as AMOLED display cannot meet the requirements of high-resolution display; and by adopting the techniques of imprinting or printing to form the organic light-emitting layer, the resolution obtained is also limited. Therefore, high-resolution AMOLED display has high technical difficulty, low product yield and high price.

With the in-depth development of quantum dot technology, the research on quantum dot light-emitting diodes (QLED) is deepening day by day, and the quantum efficiency is continuously improving and has basically reached the level of industrialization. Therefore, the industrialization of quantum dot light-emitting diodes through the use of new techniques and technologies has become the trend of future development. At present, there is no specific method to form the pattern of quantum dot light-emitting structure layer, and therefore, how to form the pattern of the quantum dot light-emitting structure layer has become a research hotspot.

SUMMARY

The embodiments of the present disclosure provide a manufacturing method of a quantum dot display panel, which includes: forming a first functional layer on a substrate; processing the first functional layer so that the first functional layer includes a processed region and the processed region includes ions having a first polarity; and forming a quantum dot layer having a second polarity in the processed region, wherein the second polarity and the first polarity are opposite electrical polarities.

For example, the processed region is corresponding to a region to be processed before the processing the first functional layer, and a concentration of the ions having the first polarity in the processed region is greater than a concentration of the ions having the first polarity in the region to be processed.

For example, by the processing the first functional layer, the first functional layer includes the processed region and an unprocessed region, and the unprocessed region is outside of the processed region; and a concentration of the ions having the first polarity in the processed region is greater than a concentration of the ions having the first polarity in the unprocessed region.

For example, a material of the first functional layer includes a photodegradable substance, and further includes at least one selected from the group consisting of nanoparticles and a bulk material.

For example, the least one selected from the group consisting of the nanoparticles and the bulk material is configured to react with a substance produced by the photodegradable substance after the processing the first functional layer, so as to form the ions having the first polarity.

For example, the processing the first functional layer so that the first functional layer includes the processed region, includes: irradiating the first functional layer with ultraviolet light so that a region which is irradiated by the ultraviolet light and which is included by the first functional layer forms the processed region.

For example, the forming the quantum dot layer having the second polarity in the processed region, includes: forming a quantum dot film having the second polarity on the first functional layer; and by washing the quantum dot film having the second polarity, removing quantum dots having the second polarity which are included in the quantum dot film having the second polarity and which are outside of the processed region, to form the quantum dot layer having the second polarity in the processed region.

For example, the manufacturing method further includes: forming a quantum dot layer having the first polarity on the quantum dot layer having the second polarity, wherein an orthographic projection of the quantum dot layer having the first polarity on the first functional layer is located in the processed region, and the quantum dot layer having the first polarity is on a side of the quantum dot layer having the second polarity away from the first functional layer.

For example, the forming the quantum dot layer having the first polarity on the quantum dot layer having the second polarity, includes: forming a quantum dot film having the first polarity on the quantum dot layer having the second polarity; and by washing the quantum dot film having the first polarity, removing quantum dots having the first polarity which are included in the quantum dot film having the first polarity and which are outside of the processed region, so as to form the quantum dot layer having the first polarity in the processed region.

For example, the quantum dot display panel includes a quantum dot light-emitting structure layer on a side of the first functional layer away from the substrate, the quantum dot light-emitting structure layer includes the quantum dot layer having the second polarity and the quantum dot layer having the first polarity, and the manufacturing method further includes: electrically neutralizing the quantum dot light-emitting structure layer so that the quantum dot light-emitting structure layer does not exhibit a polarity as a whole.

For example, the manufacturing method further includes: forming a first electrode layer, a second electrode layer and a second functional layer on the substrate, wherein the first functional layer is on a side of the first electrode layer away from the substrate, the second functional layer is on a side of the quantum dot light-emitting structure layer away from the substrate, and the second electrode layer is on a side of the second functional layer away from the substrate.

For example, the first electrode layer is a cathode layer, the first functional layer is an electron transport layer, the second functional layer is a hole transport layer, and the second electrode layer is an anode layer; or the first electrode layer is the anode layer, the first functional layer is the hole transport layer, the second functional layer is the electron transport layer, and the second electrode layer is the cathode layer.

For example, the first functional layer includes an electron transport layer, and the manufacturing method further includes: forming a cathode layer on the substrate before the forming the first functional layer on the substrate.

For example, the quantum dot layer having the second polarity is in direct contact with the first functional layer.

The embodiments of the present disclosure further provide a manufacturing method of a quantum dot display panel, which includes: providing a driving substrate, wherein the driving substrate includes a substrate and a first electrode layer on the substrate; applying an electrical signal to the first electrode layer so that a region which is included by the driving substrate and which is provided with the first electrode layer exhibits a first polarity; and forming a quantum dot layer having a second polarity on a side of the first electrode layer away from the substrate, wherein the second polarity and the first polarity are opposite electrical polarities.

For example, the driving substrate further includes a switch element on the substrate, and the switch element is electrically connected to the first electrode layer to apply the electrical signal to the first electrode layer.

For example, the quantum dot display panel includes a quantum dot light-emitting structure layer on the driving substrate, and the quantum dot light-emitting structure layer includes the quantum dot layer having the second polarity; and the manufacturing method further includes: forming a second electrode layer on a side of the quantum dot light-emitting structure layer away from the substrate, wherein one of the first electrode layer and the second electrode layer is an anode layer, and the other of the first electrode layer and the second electrode layer is a cathode layer.

For example, the manufacturing method further includes: forming a quantum dot layer having the first polarity on the quantum dot layer having the second polarity. The quantum dot light-emitting structure layer includes the quantum dot layer having the second polarity and the quantum dot layer having the first polarity.

For example, the manufacturing method further includes: forming an electron transport layer between the quantum dot light-emitting structure layer and the cathode layer, and forming a hole transport layer between the quantum dot light-emitting structure layer and the anode layer.

The embodiments of the present disclosure further provide a quantum dot display panel, which includes: a substrate; a first functional layer on the substrate, the first functional layer including a processed region, the first functional layer including ions having a first polarity in the processed region; and a quantum dot light-emitting structure layer on a side of the first functional layer away from the substrate, wherein an orthographic projection of the quantum dot light-emitting structure layer on the first functional layer is located in the processed region, the quantum dot light-emitting structure layer includes a quantum dot layer having a second polarity, and the second polarity and the first polarity are opposite electrical polarities.

For example, the first functional layer includes the processed region and an unprocessed region, and the unprocessed region is outside of the processed region; and a concentration of the ions having the first polarity in the processed region is greater than a concentration of the ions having the first polarity in the unprocessed region.

For example, the quantum dot light-emitting structure layer further includes a quantum dot layer having the first polarity, and the quantum dot layer having the first polarity is laminated on a side of the quantum dot layer having the second polarity away from the substrate.

For example, a material of the first functional layer includes a photodegradable substance, and further includes at least one selected from the group consisting of nanoparticles and a bulk material, and the first polarity is a positive polarity.

For example, the display panel further includes a cathode layer disposed on a side of the first functional layer away from the quantum dot light-emitting structure layer, and the first functional layer includes an electron transport layer.

The embodiments of the present disclosure further provide a display device, which includes the quantum dot display panel described above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DESCRIPTION OF REFERENCE NUMERALS

10—substrate; 11—electron transport layer; 12—hole transport layer; 13—anode layer; 14—cathode layer; 100—first functional layer; 200—second functional layer; 300—first electrode layer; 400—second electrode layer; 20—processed region; 21—quantum dot light-emitting structure layer; 211—quantum dot layer having first polarity; 212—quantum dot layer having second polarity; 31—red quantum dot light-emitting structure layer; 311—red quantum dot layer having first polarity; 312—red quantum dot layer having second polarity; 41—green quantum dot light-emitting structure layer; 411—green quantum dot layer having first polarity; 412—green quantum dot layer having second polarity; 51—blue quantum dot light-emitting structure layer; 511—blue quantum dot layer having first polarity; 512—blue quantum dot layer having second polarity; 2—unprocessed region; 2110—quantum dot film having first polarity; 2120—quantum dot film having second polarity; 70—switch element; 10A—driving substrate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
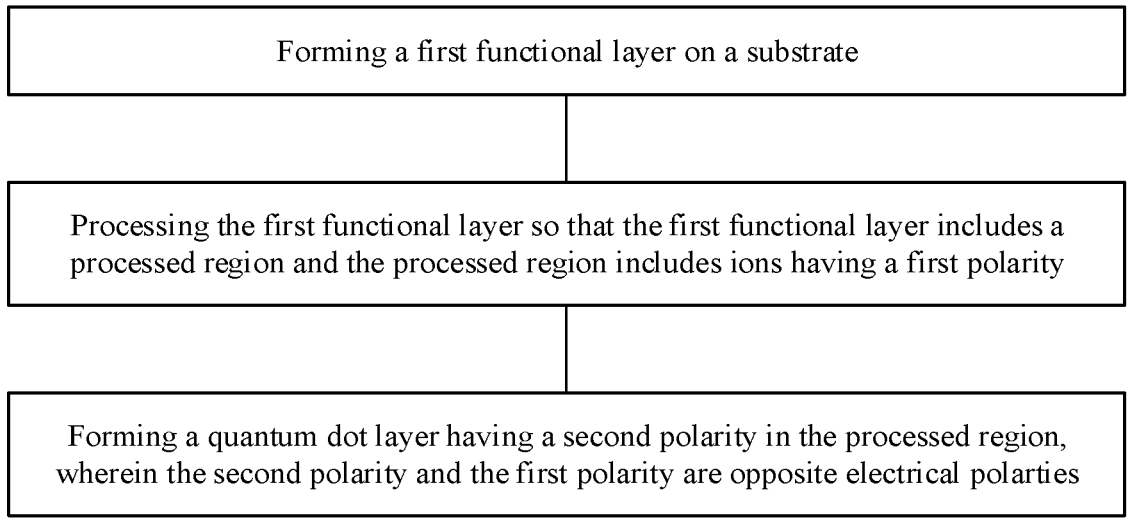
FIG. 1 is a schematic diagram of a manufacturing method of a quantum dot display panel according to at least one embodiment of the present disclosure.

FIG. 1 is a schematic diagram of a manufacturing method of a quantum dot display panel according to at least one embodiment of the disclosure. As shown in FIG. 1, the manufacturing method includes: steps S1: forming a first functional layer on a substrate; step S2: processing the first functional layer so that a processed first functional layer includes a processed region and the processed region includes ions having a first polarity; and step S3: forming a quantum dot layer having a second polarity in the processed region, so that the second polarity and the first polarity are opposite electrical polarities.

For example, the processed region is corresponding to a region to be processed before the first functional layer is processed, and a concentration of the ions having the first polarity in the processed region is greater than a concentration of the ions having the first polarity in the region to be processed. That is, the concentration of the ions having the first polarity in the processed region is increased by processing the first functional layer. This makes the attraction force between the ions having the first polarity in the processed region and quantum dots having the second polarity in a material for forming the quantum dot layer having the second polarity stronger, so that the quantum dots having the second polarity located in the processed region are retained to form the quantum dot layer having the second polarity after the material is treated (e.g., washed).

For example, by processing the first functional layer, the first functional layer includes the processed region and an unprocessed region, and the unprocessed region is outside of the processed region and directly connected to the processed region (that is, the first functional layer is a one-piece structure including the processed region and the unprocessed region); and the concentration of the ions having the first polarity in the processed region is greater than the concentration of the ions having the first polarity in the unprocessed region. For example, the first functional layer includes a plurality of processed regions which are spaced apart and a plurality of unprocessed regions, and the concentration of the ions having the first polarity in each of the plurality of processed regions is greater than the concentration of the ions having the first polarity in the plurality of unprocessed regions. For example, the concentration of the ions having the first polarity in the unprocessed region is substantially 0. Therefore, in the case where the material for forming the quantum dot layer having the second polarity is formed on the first functional layer, the attraction force between the quantum dots having the second polarity in the material and the ions having the first polarity in the processed region is relatively strong, so that after the material is washed, the quantum dots having the second polarity in the material in the processed region are retained while the quantum dots having the second polarity in the material in the unprocessed region are removed, thereby forming the quantum dot layer having the second polarity.

For example, the quantum dot layer having the second polarity is in direct contact with the first functional layer. Thus, in the process of forming the quantum dot layer having the second polarity, the attraction force between the quantum dots having the second polarity and the ions having the first polarity in the processed region of the first functional layer is relatively strong.

In the manufacturing method of the quantum dot display panel according to at least one embodiment of the present disclosure, by processing the first functional layer, the first functional layer includes the processed region, which includes the ions having the first polarity and is electrically neutral, and by using the mutual attraction of the first polarity and the second polarity, the quantum dot layer having the second polarity is formed in the processed region (e.g., the quantum dot layer having the second polarity is in direct contact with the processed region of the first functional layer), thereby forming a pattern of a quantum dot light-emitting structure layer. The manufacturing method of the quantum dot display panel is easy to realize accurate control of the processed region, so that the shape and position of the pattern of the quantum dot light-emitting structure layer can be accurately controlled, the patterning of the quantum dot light-emitting structure layer can be realized, the accuracy of the pattern can be ensured, and the display quality of the quantum dot display panel can be ensured.

For example, forming the first functional layer includes: coating a solution for forming the first functional layer on the substrate, and then developing and annealing the solution, so as to obtain the first functional layer.

For example, the processing the first functional layer includes irradiating the first functional layer with ultraviolet light (UV light) so that a region irradiated by the ultraviolet light forms the processed region including the ions having the first polarity.

For example, the material of the first functional layer includes a photodegradable substance, and further includes at least one selected from the group consisting of nanoparticles and a bulk material. For example, the least one selected from the group consisting of the nanoparticles and the bulk material is configured to react with a substance produced by the photodegradable substance after the first functional layer is processed, so as to form the ions having the first polarity. That is, the at least one of the nanoparticles and the bulk material is used to react with the substance produced by the photodegradable substance after the first functional layer is processed, so as to form the ions having the first polarity. For example, the ligands of the nanomaterial react with the substance produced by the photodegradable substance after the first functional layer is processed, so as to form the ions having the first polarity. For example, a substance produced by the bulk material after the bulk material reacts with other substance reacts with the substance produced by the photodegradable substance after the first functional layer is processed, so as to form the ions having the first polarity.

For example, the nanoparticles include zinc oxide nanoparticles. For example, the ligands of the nanoparticles include halogen atoms and quaternary ammonium salt ions. For example, the halogen atoms are chlorine atoms (Cl), bromine atoms (Br), or iodine atoms (I), or the like.

For example, the photodegradable substance includes one or more selected from the group consisting of an imide photodegradable substance (such as trimethylaminobenzimide), and an olefin diazoles photodegradable substance (such as benzophenylenediazole), etc. For example, the photodegradable substance produces an amino substance, such as primary amines, secondary amines or tertiary amines, etc., after being irradiated by the ultraviolet light. For example, the amino substance reacts with the ligands of the nanoparticles to produce the ions having the first polarity, thereby forming the processed region which includes the ions having the first polarity.

For example, the bulk material is a material with a size in the micron level or above, and the material for example includes zinc oxide. For example, the surface of the bulk material have many pendant groups thereon, such as hydroxyl groups or carboxyl groups, etc. For example, taking hydroxyl groups as an example, the first functional layer is coated with propylamine trimethoxysilane or a similar material, and then both are irradiated with ultraviolet light; propylamine trimethoxysilane or the similar material reacts with hydroxyl groups at the surface of the bulk material, so as to produce hydrogen ions after being irradiated by the ultraviolet light, and the ions having the first polarity are produced by the reaction between the hydrogen ions and the amino substance.

It should be noted that the above-mentioned embodiments of the nanoparticles, the photodegradable substance and the bulk material are merely illustrative, and the embodiments of the present disclosure include but are not limited to these cases, as long as it can be realized that the at least one selected from the group consisting of the nanoparticles and the bulk material is configured to react with the substance produced by the photodegradable substance after the first functional layer is processed, so as to form the ions having the first polarity.

For example, the quantum dot display panel according to at least one embodiment of the present disclosure includes the quantum dot light-emitting structure layer on a side of the first functional layer facing away from the substrate, and the quantum dot light-emitting structure layer includes the quantum dot layer having the second polarity.

For example, the quantum dot light-emitting structure layer further includes a quantum dot layer having the first polarity, and an orthographic projection of the quantum dot layer having the first polarity on the first functional layer is located in the processed region. That is, the orthographic projection of the quantum dot layer having the first polarity on the substrate is located within an orthographic projection of the quantum dot layer having the second polarity on the substrate (e.g., the orthographic projections of them substantially coincide with each other, and "substantially" means within the tolerance range of error). Moreover, the quantum dot layer having the first polarity is on a side of the quantum dot layer having the second polarity away from the first functional layer. For example, the quantum dot layer having the first polarity is in direct contact with the quantum dot layer having the second polarity, so as to improve the attraction force between the quantum dots having the first polarity in the material for forming the quantum dot layer having the first polarity and the quantum dots having the second polarity in the material for forming the quantum dot layer having the second polarity.

For example, the quantum dot light-emitting structure layer includes n quantum dot layers, and n is greater than or equal to 1. In the case where n=1, the quantum dot light-emitting structure layer includes only one quantum dot layer having the second polarity, as shown in FIG. 3B; in the case where n=2, the quantum dot light-emitting structure layer only includes one quantum dot layer having the second polarity and one quantum dot layer having the first polarity, as shown in FIG. 4B; in the case where n=3, the quantum dot light-emitting structure layer includes two quantum dot layers having the second polarity and one quantum dot layer having the first polarity which is sandwiched between the two quantum dot layers having the second polarity; and so on, and details will not be described here.

For example, the quantum dot display panel includes a plurality of quantum dot light-emitting structure layers which are spaced apart, and for example, the plurality of quantum dot light-emitting structure layers include quantum dot light-emitting structure layers for emitting light of different colors respectively. For example, the plurality of quantum dot light-emitting structure layers include a red light-emitting structure layer, a green light-emitting structure layer, and a blue light-emitting structure layer.

For example, forming the quantum dot layer having the second polarity includes: coating a solution for forming the quantum dot layer having the second polarity on the first functional layer, and then sequentially annealing and washing the solution, so as to form the quantum dot layer having the second polarity. Similarly, forming the quantum dot layer having the first polarity includes: coating a solution for forming the quantum dot layer having the first polarity on the quantum dot layer having the second polarity, and then sequentially annealing and washing the solution, so as to form the quantum dot layer having the first polarity. For example, hexane or a similar material can be used for washing.

For example, the manufacturing method provided by the embodiments of the present disclosure further includes: forming a first electrode layer, a second electrode layer and a second functional layer on the substrate. The first functional layer is on a side of the first electrode layer away from the substrate, the second functional layer is on a side of the quantum dot light-emitting structure layer away from the substrate, and the second electrode layer is on a side of the second functional layer away from the substrate. For example, one of the first functional layer and the second functional layer is an electron transport layer and the other of the first functional layer and the second functional layer is a hole transport layer. For example, one of the first electrode layer and the second electrode layer is an anode layer and the other of the first electrode layer and the second electrode layer is a cathode layer.

For example, the first electrode layer is a cathode layer, the first functional layer is an electron transport layer, the second functional layer is a hole transport layer, and the second electrode layer is an anode layer; or, the first electrode layer is an anode layer, the first functional layer is a hole transport layer, the second functional layer is an electron transport layer, and the second electrode layer is a cathode layer.

For example, in the case where the plurality of quantum dot light-emitting structure layers are included, a plurality of first electrode layers corresponding to the plurality of quantum dot light-emitting structure layers are disconnected from each other (e.g., the plurality of quantum dot light-emitting structure layers are in one-to-one correspondence with the plurality of first electrode layers); furthermore, for example, the plurality of quantum dot light-emitting structure layers share the second electrode layer, and/or share the first functional layer, and/or share the second functional layer. By sharing a same layer, the manufacturing process can be simplified. In other embodiments, at least one selected from the group consisting of the cathode layer, the electron transport layer and the hole transport layer is not shared.

For example, the quantum dot light-emitting display panel further includes a plurality of switch elements on the substrate, and the plurality of switch elements are electrically connected to the plurality of first electrode layers corresponding to the plurality of quantum dot light-emitting structure layers respectively (e.g., the plurality of switch elements are electrically connected to the plurality of first electrode layers in one-to-one correspondence), so as to control the light-emitting states of the plurality of quantum dot light-emitting structure layers via the plurality of switch elements, respectively.

For example, the plurality of switch elements are transistors or switches of other types, without being limited in the embodiments of the present disclosure.

The manufacturing method of the quantum dot display panel according to at least one embodiment of the present disclosure will be described in detail below with reference to the accompanying drawings. For example, the manufacturing method provided by at least one embodiment of the present disclosure includes steps S11-S12 as follows.

Figure 2:
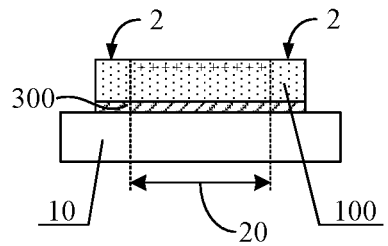
FIG. 2 is a schematic structural diagram after forming ions having a first polarity in a processed region of a first functional layer according to at least one embodiment of the present disclosure.

FIG. 2 is a schematic structural diagram after forming the ions having the first polarity in the processed region of the first functional layer according to at least one embodiment of the present disclosure.

Step S11: as shown in FIG. 2, forming the first functional layer 100 on the substrate 10.

For example, the material of the first functional layer 100 formed on the substrate 10 includes at least one selected from the group consisting of the nanoparticles and the bulk material, and further includes the photodegradable substance.

For example, a spin coating process is used to coat a first functional solution (i.e., the solution for forming the first functional layer 100) on the substrate 10. The first functional solution includes the photodegradable substance, and further includes the nanoparticles and/or the bulk materials. For example, in the spin coating process, a spin coating speed is in a range of 3500 rpm to 4500 rpm, preferably 4000 rpm; and spin coating time is in a range of 35 s to 45 s, preferably 40 s. After that, the first functional solution is sequentially developed and annealed, so as to obtain the first functional layer. For example, the first functional layer is obtained by developing the first functional solution with toluene for 5 minutes and then annealing, for example, at 85 degrees Celsius.

Step S12: forming the quantum dot light-emitting structure layer, so that the quantum dot light-emitting structure layer includes the quantum dot layer having the second polarity.

For example, step S12 includes step S121: processing the first functional layer 100 so that the processed first functional layer 100 includes the processed region 20 and the processed region 20 includes the ions having the first polarity, as shown in FIG. 2.

For example, the ions having the first polarity are positively charged ions, and a plurality of "+" are shown in FIG. 2 to illustratively represent the positive polarity; alternatively, the ions having the first polarity are negatively charged ions.

For example, as shown in FIG. 2, the processed first functional layer 100 includes the processed region 20 and the unprocessed region 2. The unprocessed region 2 is outside of the processed region 20 and directly connected to the processed region 20 (that is, the first functional layer 100 is a one-piece structure); and the concentration of the ions having the first polarity in the processed region 20 is greater than the concentration of the ions having the first polarity in the unprocessed region 2.

For example, step S121 includes: irradiating the first functional layer with UV light so that a region irradiated by the ultraviolet light forms the processed region 20 and that the processed region 20 includes the ions having the first polarity.

For example, a mask is used to control the range of the first functional layer irradiated by the ultraviolet light. In this case, for example, the mask is arranged on an upper side of the first functional layer, so that a light-transmission region of the mask corresponds to the region to be processed of the first functional layer, and a non-light-transmission region of the mask corresponds to a region which is included by the first functional layer and which is outside the region to be processed; afterwards, the ultraviolet light passes through the light-transmission region of the mask plate and then irradiates on the first functional layer.

In step S121, the formation principle of the processed region 20 is as follows: after the first functional layer 100 is irradiated with the UV light, the photodegradable substance in the region irradiated by the UV light is decomposed to produce the amino substance; the ligands of the nanoparticles include halogen atoms and quaternary ammonium salt ions, for example, the halogen atoms are chlorine atoms (Cl), bromine atoms (Br) or iodine atoms (I), the amino substance reacts with the ligands of the nanoparticles to produce the ions having the first polarity, thereby forming the processed region 20 which includes the ions having the first polarity. For example, the surface of the bulk material have many pendant groups, such as hydroxyl groups, or carboxyl groups, or the like. Taking hydroxyl groups as an example, propylamine trimethoxysilane is used to react with the hydroxyl groups at the surface of the bulk material, so as to produce hydrogen ions after being irradiated by UV light, and the ions having the first polarity are produced by the reaction between the hydrogen ions and the amino substance. In at least one embodiment of the present disclosure, for example, the UV light irradiation time is in the range of 4 min to 6 min, preferably 5 min. It is easy to be understood that in actual implementations, the region of the first functional layer irradiated by UV light can be accurately controlled, so that the processed region can be accurately controlled, thereby realizing an accurate control of the pattern of the quantum dot light-emitting structure layer.

For example, step S121 further includes: annealing the first functional layer. The first functional layer is annealed so that molecules in the first functional layer are rearranged, which is beneficial to carrier transport.

For example, the annealing temperature is in the range of 75 degrees Celsius to 90 degrees Celsius, and the annealing time is in the range of 15 min to 25 min. In at least one embodiment of the present disclosure, for example, the annealing temperature is 85 degrees Celsius, and the annealing time is 20 min.

For example, step S12 further includes step S122: forming the quantum dot layer 211 having the second polarity in the processed region 20, and the second polarity and the first polarity are opposite electrical polarity, as shown in FIG. 3B. FIG. 3B is a schematic structural diagram after forming the quantum dot layer having the second polarity in the processed region according to at least one embodiment of the present disclosure.

For example, step S122 includes the following steps.

Figure 3A:
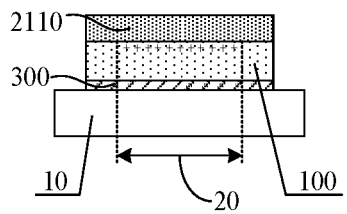
FIG. 3A is a schematic structural diagram after forming a quantum dot film having a second polarity on the first functional layer according to at least one embodiment of the disclosure.
Figure 3B:
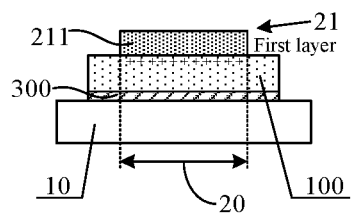
FIG. 3B is a schematic structural diagram after forming a quantum dot layer having the second polarity in the processed region according to at least one embodiment of the present disclosure.

Step S1221: forming a quantum dot film 2110 having the second polarity on the first functional layer 100, as shown in FIG. 3A.

For example, a spin coating process is used to coat quantum dots having the second polarity on the first functional layer 100 (e.g., the first functional layer 100 is an electron transport layer), so as to form the quantum dot film 2110 having the second polarity. For example, in the spin coating process, the spin coating speed is in the range of 2000 rpm to 3000 rpm, preferably 2500 rpm; and the spin coating time is in the range of 40 s to 50 s, preferably 45 s.

For example, the quantum dots having the second polarity includes one or more selected from the group consisting of CdSe quantum dots having the second polarity and ZnS quantum dots having the second polarity.

Step S1222: annealing the quantum dot film 2110 having the second polarity. The quantum dot film having the second polarity is annealed, so that a solvent in the quantum dot film having the second polarity is removed and that molecules of the quantum dots having the second polarity are rearranged, which is beneficial to carrier transport.

For example, the annealing temperature is in the range of 75 degrees Celsius to 90 degrees Celsius, and the annealing time is in the range of 15 min to 25 min. For example, in at least one embodiment of the present disclosure, the annealing temperature is 85 degrees Celsius, and the annealing time is 20 min.

Step S1223: washing the quantum dot film 2110 having the second polarity to remove the quantum dots having the second polarity which are located in a region outside the processed region 20, so as to form the quantum dot layer 221 having the second polarity in the processed region 20, as shown in FIG. 3B.

In at least one embodiment of the present disclosure, for example, hexane is used to wash the quantum dot film having the second polarity. The second polarity is opposite to the first polarity in electric polarity. Therefore, in the case that the quantum dot film having the second polarity is washed by hexane, the quantum dots having the second polarity in the processed region 20 cannot be washed off by hexane due to the mutual attraction between the quantum dots having the second polarity and the ions having the first polarity in the processed region 20, and the quantum dots having the second polarity outside the processed region 20 is washed off by hexane due to having no mutual interaction with the first functional layer (e.g., electron transport layer), thus forming the quantum dot layer 221 having the second polarity in the processed region 20.

For example, the quantum dot light-emitting structure layer further includes the quantum dot layer having the first polarity. In this case, the manufacturing method provided by at least one embodiment of the present disclosure, for example, further includes step S123: forming the quantum dot layer 212 having the first polarity in the processed region 20 on the quantum dot layer 211 having the second polarity, as shown in FIG. 4B. FIG. 4B is a schematic structural diagram after forming the quantum dot layer having the first polarity which is within the processed region on the quantum dot layer having the second polarity according to at least one embodiment of the disclosure.

For example, step S123 includes the following steps.

Figure 4A:
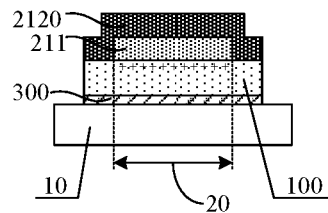
FIG. 4A is a schematic structural diagram after forming a quantum dot film having the first polarity on the quantum dot layer having the second polarity according to at least one embodiment of the disclosure.
Figure 4B:
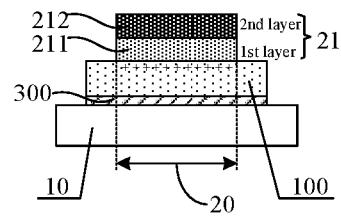
FIG. 4B is a schematic structural diagram after forming a quantum dot layer having the first polarity which is within the processed region on the quantum dot layer having the second polarity according to at least one embodiment of the disclosure.

Step S1231: forming a quantum dot film 2120 having the first polarity on the quantum dot layer 211 having the second polarity, as shown in FIG. 4A.

For example, a spin coating process is used to form the quantum dot film having the first polarity on the quantum dot layer 211 having the second polarity, and the quantum dot film having the first polarity covers the first functional layer 100. For example, in the spin coating process, the spin coating speed is in the range of 2000 rpm to 3000 rpm, preferably 2500 rpm; and the spin coating time is in the range of 40 s to 50 s, preferably 45 s.

For example, the quantum dots having the first polarity includes one or more selected form the group consisting of CdSe quantum dots having the first polarity and ZnS quantum dots having the first polarity.

Step S1232: annealing the quantum dot film 2120 having the first polarity. The quantum dot film having the first polarity is annealed, so that the solvent in the quantum dot film having the first polarity can be removed and molecules of the quantum dots having the first polarity can be rearranged, which is beneficial to carrier transport.

For example, the annealing temperature is in the range of 75 degrees Celsius to 90 degrees Celsius, and the annealing time is in the range of 15 min to 25 min. For example, in at least one embodiment of the present disclosure, the annealing temperature is 85 degrees Celsius, and the annealing time is 20 min.

Step S1233: washing the quantum dot film 2110 having the first polarity to remove the quantum dots having the first polarity which are located in the region outside of the processed region 20, so as to form the quantum dot layer 221 having the first polarity in the processed region 20, and the quantum dot layer 212 having the first polarity is laminated on an upper side of the quantum dot layer 211 having the second polarity (that is, on a side of the quantum dot layer 211 having the second polarity away from the first functional layer 100), as shown in FIG. 4B.

In at least one embodiment of the present disclosure, for example, hexane is used to wash the quantum dot film having the first polarity. The second polarity is opposite to the first polarity in electric polarity. Therefore, in the case that the quantum dot film having the first polarity is washed by hexane, the quantum dots having the first polarity in the processed region 20 cannot be washed off by hexane due to the mutual attraction between the quantum dots having the first polarity and the quantum dots having the second polarity in the processed region 20, and the quantum dots having the first polarity outside of the processed region 20 is washed off by hexane due to having no mutual interaction with the first functional layer (e.g., electron transport layer), thus forming the quantum dot layer 212 having the first polarity in the processed region 20, and the quantum dot layer 212 having the first polarity is laminated on the upper side of the quantum dot layer 211 having the second polarity.

Figure 5:
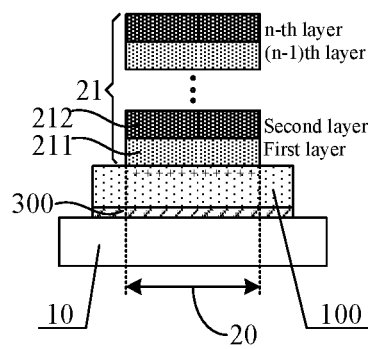
FIG. 5 is a schematic structural diagram after forming an n-th quantum dot layer, where n≥3, according to at least one embodiment of the disclosure.

FIG. 5 is a schematic structural diagram after forming an n-th quantum dot layer, where n≥3, according to at least one embodiment of the disclosure. In the case where n=1, the fabrication of the quantum dot light-emitting structure layer is completed after step S122 is completed; in the case where n=2, the fabrication of the quantum dot light-emitting structure layer is completed after step S123 is completed; in the case where n≥3, the quantum dot layer having the second polarity and the quantum dot layer having the first polarity can be repeatedly fabricated in sequence by means of step S122 and step S123 until the n-th quantum dot layer is fabricated, so as to complete the fabrication of the quantum dot light-emitting structure layer, as shown in FIG. 5.

It is easy to be understood that FIG. 5 merely illustratively shows that the quantum dot light-emitting structure layer 21 includes n quantum dot layers, and the n-th quantum dot layer can be a quantum dot layer having the first polarity, or can be a quantum dot layer having the second polarity, which needs to be determined according to actual conditions.

For example, in the case where n≥2, the manufacturing method of the quantum dot display panel provided by at least one embodiment of the present disclosure further includes step S124: electrically neutralizing the quantum dot light-emitting structure layer so that the quantum dot light-emitting structure layer does not exhibit a polarity as a whole.

In at least one embodiment of the present disclosure, for example, the first polarity is a positive polarity and the second polarity is a negative polarity. In the case where the n-th layer of quantum dots are the quantum dots having the first polarity, i.e. the quantum dots having the positive polarity, a solution having corresponding negative ions is used for soaking, for example. For example, the ligands of the quantum dots and amines produce ammonium ions with positive charge, and dilute alkali solution (potassium hydroxide) is used for soaking during neutralization of the positive charge, and hydroxide ions react with hydrogen positive ions of ammonium salt groups to obtain electrically neutral quantum dots. In the case where the n-th layer of quantum dots are the quantum dots having the second polarity, i.e. the quantum dots having the negative polarity, a solution having corresponding positive ions is used for soaking, for example. For example, the ligands of the quantum dots include sulfonate ions with negative charge, and dilute acid solution (dilute hydrochloric acid) is used for soaking during neutralization of the negative charge, and hydrogen ions and sulfonate ions are combined to remove the negative charges on the surface of quantum dots.

After the quantum dot light-emitting structure layer is manufactured, the quantum dot light-emitting structure layer is electrically neutralized so that the quantum dot light-emitting structure layer does not exhibit a polarity as a whole. Thus, quantum dot light-emitting structure layers for emitting light of other corresponding colors can be manufactured by the same method, without affecting the previously manufactured quantum dot light-emitting structure layer.

For example, the manufacturing method of the quantum dot display panel provided by at least one embodiment of the present disclosure further includes step S125: forming the second functional layer 200 on the quantum dot light-emitting structure layer.

Figure 6:
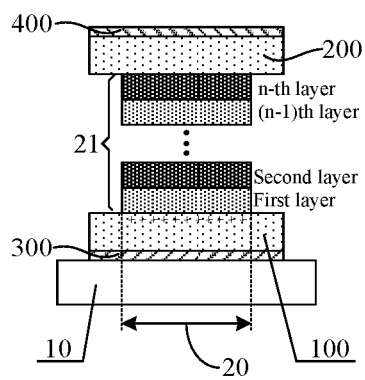
FIG. 6 is a schematic structural diagram after forming a second electrode layer according to at least one embodiment of the disclosure.

For example, the second functional layer 200 is formed by a deposition method or a coating method, as shown in FIG. 6. FIG. 6 is a schematic structural diagram after forming the second electrode layer according to at least one embodiment of the present disclosure.

For example, the manufacturing method provided by at least one embodiment of the present disclosure further includes: forming the second electrode layer 400 on the second functional layer 200.

For example, the manufacturing method of the quantum dot display panel provided by at least one embodiment of the present disclosure, before forming the first functional layer 100, further includes: forming the first electrode layer 300 on the substrate 10.

In at least one embodiment of the present disclosure, the first polarity includes one of a positive polarity and a negative polarity, and the second polarity includes the other of the positive polarity and the negative polarity. The first electrode layer includes one of an anode layer and a cathode layer, and the second electrode layer includes the other of the anode layer and the cathode layer. The first functional layer includes one of an electron transport layer and a hole transport layer, and the second functional layer includes the other of the electron transport layer and the hole transport layer.

In at least one embodiment of the present disclosure, the first polarity is the positive polarity, the second polarity is the negative polarity, and the second polarity is opposite to the first polarity in electric polarity. The first electrode layer is the cathode layer and the second electrode layer is the anode layer. The first functional layer is the electron transport layer and the second functional layer is the hole transport layer. In at least one embodiment of the present disclosure, the light-emitting structure layer being formed is an inverted light-emitting structure layer, that is, along a direction away from the substrate 10, the light-emitting structure layer sequentially includes the cathode layer, the electron transport layer, the quantum dot light-emitting structure layer, the hole transport layer and the anode layer. It is easy to be understood that the manufacturing method of the quantum dot display panel provided by the embodiments of the present disclosure are also applicable for a forward light-emitting structure layer, that is, along the direction away from the substrate 10, the light-emitting structure layer sequentially includes the anode layer, the hole transport layer, the quantum dot light-emitting structure layer, the electron transport layer and the cathode layer.

Figure 7:
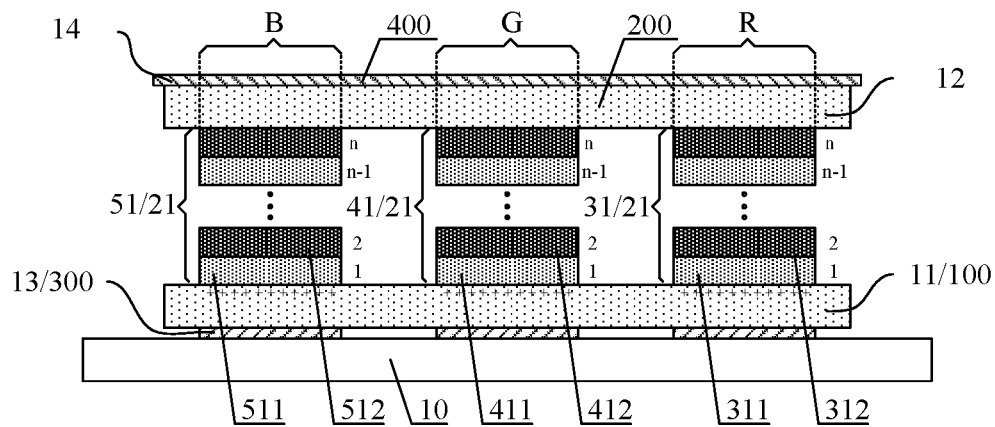
FIG. 7 is a schematic structural diagram of the display panel manufactured according to at least one embodiment of the present disclosure.

FIG. 7 is a schematic structural diagram of a display panel manufactured according to at least one embodiment of the present disclosure.

For example, the manufacturing method of the display panel provided by at least another embodiment of the present disclosure includes: respectively manufacturing the light-emitting structure layer corresponding to each pixel region by using the manufacturing method according to any one of the above embodiments. A specific manufacturing process of the display panel is illustrated below by taking the display panel which includes three kinds of pixels as an example. As shown in FIG. 7, in at least one embodiment of the present disclosure, the first pixel is a red (R) pixel, the second pixel is a green (G) pixel, and the third pixel is a blue (B) pixel. In at least one embodiment of the present disclosure, the light-emitting structure layer corresponding to each pixel includes n layers of quantum dot layers, where n is a natural number.

For example, the manufacturing method of the display panel shown in FIG. 7 provided by at least one embodiment of the present disclosure includes the following steps.

Step S21: as shown in FIG. 7, forming the first functional layer (e.g., electron transport layer 11) on the substrate 10.

For example, the material of the first functional layer (e.g., electron transport layer) formed on the substrate 10 includes at least one selected from the group consisting of the nanoparticles and the bulk material, and further includes the photodegradable substance.

For example, a spin coating process is used to coat the solution for forming the first functional layer (e.g., electron transport layer) on the substrate 10, the solution includes the photodegradable substance, and further includes the nanoparticles and/or the bulk material. For example, the spin coating speed is in the range of 3500 rpm to 4500 rpm, preferably 4000 rpm; and the spin coating time is in the range of 35 s to 45 s, preferably 40 s.

For example, the nanoparticles include zinc oxide nanoparticles.

For example, the photodegradable substance includes one or more selected from the group consisting of an imides sustance (such as trimethylaminobenzimide), and an olefin diazoles (e.g., benzophenylenediazole), etc.

For example, the bulk material is a material with a size in micron level or above, and the material for example includes zinc oxide. For example, the photodegradable substance produces an amino substance, such as primary amines, secondary amines or tertiary amines, etc., after being irradiated by UV light.

Step S22: forming a red quantum dot light-emitting structure layer, and the red quantum dot light-emitting structure layer includes a red quantum dot layer having the second polarity.

For example, step S22 includes the following steps.

Step S221: processing the first functional layer 100 to form a first processed region at the first functional layer 100, so that the first processed region includes ions having the first polarity. For example, the first processed region is referred to as a red pixel region.

For example, step S221 includes steps S221-S222 as follows.

Step S2211: irradiating the first functional layer (e.g., electron transport layer) with UV light so that a region irradiated by the UV light forms the first processed region, the first processed region includes ions having the first polarity, and the first processed region is the red pixel region.

For example, after the first functional layer (e.g., electron transport layer) is irradiated with UV light, the photodegradable substance in the region irradiated by UV light is decomposed to produce an amino substance. The ligands of the nanoparticles include halogen atoms and quaternary ammonium salt ions, the halogen atoms are chlorine atoms (Cl), bromine atoms (Br) or iodine atoms (I). The amino substance reacts with the ligands of the nanoparticles to produce the ions having the first polarity, thereby forming the first processed region (i.e. the red pixel region) which includes the ions having the first polarity. The surface of the bulk material have many pendant groups, such as hydroxyl groups, or carboxyl groups, or the like. Taking hydroxyl groups as an example, propylamine trimethoxysilane is used to react with the hydroxyl groups at the surface of the bulk material, so as to produce hydrogen ions after being irradiated by UV light, and the ions having the first polarity are also produced by the reaction between the hydrogen ions and the amino substance.

In at least one embodiment of the present disclosure, for example, the UV light irradiation time is in the range of 4 min to 6 min, preferably 5 min.

Step S2211: annealing the first functional layer (e.g., electron transport layer) irradiated by UV light.

For example, the annealing temperature is in the range of 75 degrees Celsius to 90 degrees Celsius, and the annealing time is in the range of 15 min to 25 min. In at least one embodiment of the present disclosure, for example, the annealing temperature is 85 degrees Celsius, and the annealing time is 20 min.

Step S222: forming a red quantum dot layer 311 having the second polarity in the red pixel region. The second polarity and the first polarity are opposite electrical polarities.

For example, step S222 includes the following steps.

Step S2221: forming a red quantum dot film having the second polarity on the first functional layer (e.g., electron transport layer 11).

For example, a spin coating process is used to coat red quantum dots having the second polarity on the electron transport layer, so as to form the red quantum dot film having the second polarity. For example, the spin coating speed is in the range of 2000 rpm to 3000 rpm, preferably 2500 rpm; and the spin coating time is in the range of 40 s to 50 s, preferably 45 s.

For example, the red quantum dots having the second polarity include one or more selected from the group consisting of CdSe quantum dots having the second polarity and ZnS quantum dots having the second polarity.

Step S2222: annealing the red quantum dot film having the second polarity.

For example, the annealing temperature is in the range of 75 degrees Celsius to 90 degrees Celsius, and the annealing time is in the range of 15 min to 25 min. In at least one embodiment of the present disclosure, for example, the annealing temperature is 85 degrees Celsius, and the annealing time is 20 min.

Step S2223: washing the red quantum dot film having the second polarity to remove the red quantum dots which are located in a region outside of the red pixel region, so as to form the red quantum dot layer 311 having the second polarity in the red pixel region.

In at least one embodiment of the present disclosure, for example, hexane is used to wash the red quantum dot film having the second polarity. The second polarity is opposite to the first polarity in electric polarity. Therefore, in the case that the red quantum dot film having the second polarity is washed by hexane, the red quantum dots having the second polarity in the red pixel region cannot be washed off by hexane due to the mutual attraction between the red quantum dots having the second polarity and the ions having the first polarity in the red region, and the red quantum dots having the second polarity outside the red pixel region is washed off by hexane due to having no mutual interaction with the electron transport layer, thus forming the red quantum dot layer 311 having the second polarity in the red pixel region.

For example, the red quantum dot light-emitting structure layer further includes a red quantum dot layer having the first polarity. In this case, the manufacturing method provided by at least one embodiment of the present disclosure, for example, further include step S223: forming the red quantum dot layer 312 having the first polarity in the red pixel region on the red quantum dot layer 311 having the second polarity.

For example, step S223 includes the following steps.

Step S2231: forming a red quantum dot film having the first polarity on the red quantum dot layer 311 having the second polarity.

For example, a spin coating process is used to form the red quantum dot film having the first polarity which has a first polarity property on the red quantum dot layer 311 having the second polarity, and the red quantum dot film having the first polarity for example covers the electron transport layer 11. For example, the spin coating speed is in the range of 2000 rpm to 3000 rpm, preferably 2500 rpm; and the spin coating time is in the range of 40 s to 50 s, preferably 45 s.

For example, the red quantum dots having the first polarity include one or more selected form the group consisting of CdSe quantum dots having the first polarity and ZnS quantum dots having the first polarity.

Step S2232: annealing the red quantum dot film having the first polarity. For example, the annealing temperature is in the range of 75 degrees Celsius to 90 degrees Celsius, and the annealing time is in the range of 15 min to 25 min. For example, in at least one embodiment of the present disclosure, the annealing temperature is 85 degrees Celsius, and the annealing time is 20 min.

Step S2233: washing the red quantum dot film having the first polarity to remove the red quantum dots having the first polarity which are located in the region outside of the red pixel region, so as to form a red quantum dot layer 312 having the first polarity in the red pixel region, so that the red quantum dot layer 312 having the first polarity is laminated on the upper side of the red quantum dot layer 311 having the second polarity.

In at least one embodiment of the present disclosure, for example, hexane is used to wash the red quantum dot film having the first polarity. The second polarity is opposite to the first polarity in electric polarity. Therefore, in the case that the red quantum dot film having the first polarity is washed by hexane, the red quantum dots having the first polarity in the red pixel region cannot be washed off by hexane due to the mutual attraction between the red quantum dots having the first polarity and the red quantum dots having the second polarity in the red region, and the red quantum dots having the first polarity outside the red pixel region is washed off by hexane due to having no mutual interaction with the electron transport layer, thus forming the red quantum dot layer 312 having the first polarity in the red pixel region. The red quantum dot layer 312 having the first polarity is laminated on the upper side of the red quantum dot layer 311 having the second polarity, and the red quantum dot layer 312 having the first polarity has the first polarity property.

In the case where n=1, the fabrication of the red quantum dot light-emitting structure layer is completed after step S222 is completed; in the case where n=2, the fabrication of the red quantum dot light-emitting structure layer is completed after step S223 is completed; in the case where n≥3, the red quantum dot layer having the second polarity and the red quantum dot layer having the first polarity can be repeatedly fabricated in sequence by means of step S222 and step S223 until the n-th layer of red quantum dot layer is fabricated, so as to complete the fabrication of the red quantum dot light-emitting structure layer.

For example, in the case where n≥2, the manufacturing method of the red quantum dot light-emitting structure layer further includes step S224: electrically neutralizing the red quantum dot light-emitting structure layer so that the red quantum dot light-emitting structure layer does not exhibit a polarity as a whole.

In at least one embodiment of the present disclosure, for example, the first polarity is a positive polarity and the second polarity is a negative polarity. In the case where the n-th layer of red quantum dots are the red quantum dots having the first polarity, i.e. the red quantum dots having the positive polarity, a solution having corresponding negative ions is used for soaking, for example. For example, the ligands of the quantum dots and amines produce ammonium ions with positive charge, dilute alkali solution (potassium hydroxide) is used for soaking during neutralization of the positive charge, and hydroxide ions react with hydrogen positive ions of ammonium salt groups to obtain electrically neutral quantum dots. In the case where the n-th layer of red quantum dots are the red quantum dots having the second polarity, i.e. the red quantum dots having the negative polarity, a solution having corresponding positive ions is used for soaking, for example. For example, the ligands of the quantum dots include sulfonate ions with negative charge, and dilute acid solution (dilute hydrochloric acid) is used for soaking during neutralization of the negative charge, and hydrogen ions and sulfonate ions are combined to remove the negative charges at the surface of quantum dots.

After the red quantum dot light-emitting structure layer is manufactured, the red quantum dot light-emitting structure layer is electrically neutralized so that the red quantum dot light-emitting structure layer does not exhibit a polarity as a whole. Thus, quantum dot light-emitting structure layers for emitting light of corresponding colors in other pixel regions can be manufactured by the same method, without affecting the previously manufactured red quantum dot light-emitting structure layer.

Step S23: forming a green quantum dot light-emitting structure layer, so that the green quantum dot light-emitting structure layer includes a green quantum dot layer having the second polarity and a green quantum dot layer having the first polarity.

For example, step S23 includes at least the following steps.

Step S231: processing the first functional layer 100 to form a second processed region at the first functional layer 100, so that the second processed region includes ions having the first polarity. For example, the second processed region is referred to as a green pixel region. The method of forming the green pixel region at the first functional layer 100 is the same as the method of forming the red pixel region at the first functional layer 100, and details will not be repeated here.

Step S232: forming a green quantum dot layer 411 having the second polarity in the green pixel region. The second polarity and the first polarity are opposite electrical polarities. The method of forming the green quantum dot layer 411 having the second polarity in the green pixel region is the same as the method of forming the red quantum dot layer 411 having the second polarity in the red pixel region, and details will not be repeated here.

For example, the green quantum dot light-emitting structure layer further includes a green quantum dot layer having the first polarity. In this case, the manufacturing method provided by at least one embodiment of the present disclosure for example further includes step S233: forming a green quantum dot layer 412 having the first polarity in the green pixel region on the green quantum dot layer 411 having the second polarity. The method used in this step is the same as the method used to form the red quantum dot layer 312 having the first polarity in the red pixel region on the red quantum dot layer 311 having the second polarity, and details will not be repeated here.

In the case where n=1, the fabrication of the green quantum dot light-emitting structure layer is completed after step S232 is completed; in the case where n=2, the fabrication of the green quantum dot light-emitting structure layer is completed after step S233 is completed; in the case where n≥3, the green quantum dot layer having the second polarity and the green quantum dot layer having the first polarity can be repeatedly fabricated in sequence by means of step S232 and step S233 until the n-th green quantum dot layer is fabricated, so as to complete the fabrication of the green quantum dot light-emitting structure layer.

For example, in the case where n≥2, the manufacturing method of the green quantum dot light-emitting structure layer further includes step S234: electrically neutralizing the green quantum dot light-emitting structure layer 41 so that the green quantum dot light-emitting structure layer 41 does not exhibit a polarity as a whole. The method of electrically neutralizing the green quantum dot light-emitting structure layer 41 can be the same as the method of electrically neutralizing the red quantum dot light-emitting structure layer 31, and details will not be repeated here.

Step S24: forming a blue quantum dot light-emitting structure layer, so that the blue quantum dot light-emitting structure layer includes a blue quantum dot layer having the second polarity and a blue quantum dot layer having the first polarity.

For example, step S24 includes the following steps.

Step S241: processing the first functional layer 100 to form a third processed region at the first functional layer 100, so that the second processed region includes ions having the first polarity. For example, the third processed region is referred to as a blue pixel region. The method of forming the blue pixel region at the first functional layer 100 is the same as the method of forming the red pixel region at the first functional layer 100, and details will not be repeated here.

Step S242: forming a blue quantum dot layer 511 having the second polarity in the blue pixel region. The second polarity and the first polarity are opposite electrical polarities. The method of forming the blue quantum dot layer 511 having the second polarity in the blue pixel region is the same as the method of forming the red quantum dot layer 411 having the second polarity in the red pixel region, and details will not be repeated here.

For example, the blue quantum dot light-emitting structure layer further includes a blue quantum dot layer having the first polarity. In this case, the manufacturing method provided by at least one embodiment of the present disclosure for example further include step S243: forming a blue quantum dot layer 512 having the first polarity in the blue pixel region on the blue quantum dot layer 511 having the second polarity. The method used in this step is the same as the method used to form the red quantum dot layer 312 having the first polarity in the red pixel region on the red quantum dot layer 311 having the second polarity, and details will not be repeated here.

In the case where n=1, the fabrication of the blue quantum dot light-emitting structure layer is completed after step S242 is completed; in the case where n=2, the fabrication of the blue quantum dot light-emitting structure layer is completed after step S243 is completed; in the case where n≥3, the blue quantum dot layer having the second polarity and the blue quantum dot layer having the first polarity can be repeatedly fabricated in sequence by means of step S242 and step S243 until the n-th blue quantum dot layer is fabricated, so as to complete the fabrication of the blue quantum dot light-emitting structure layer.

For example, in the case where n≥2, the manufacturing method of the blue quantum dot light-emitting structure layer further includes step S244: electrically neutralizing the blue quantum dot light-emitting structure layer 51 so that the blue quantum dot light-emitting structure layer 51 does not exhibit a polarity as a whole. The method of electrically neutralizing the blue quantum dot light-emitting structure layer 51 can be the same as the method of electrically neutralizing the red quantum dot light-emitting structure layer 31, and details will not be repeated here.

Step S25: forming the hole transport layer 12 on the red quantum dot light-emitting structure layer, the green quantum dot light-emitting structure layer and the blue quantum dot light-emitting structure layer, as shown in FIG. 5.

For example, the manufacturing method provided by at least one embodiment of the present disclosure further includes: forming the anode layer 14 (an example of the second electrode layer 400) on the hole transport layer 12.

For example, the manufacturing method provided by at least one embodiment of the present disclosure further included: forming the cathode layer 13 (an example of the first electrode layer 300) on the substrate 10 before forming the electron transport layer 11.

In the display panel formed according to at least one embodiment of the present disclosure, the red light-emitting structure layer, the green light-emitting structure layer and the blue light-emitting structure layer share the electron transport layer 11 and the hole transport layer 12; alternatively, the three light-emitting structure layers may not share the electron transport layer or the hole transport layer. For example, the cathode layers corresponding to the three light-emitting structure layers are usually electrically connected to each other, and the anode layers corresponding to the three light-emitting structure layers are disconnected from each other.

In the display panel formed according to the embodiments of the present disclosure, the light-emitting structure layer is an inverted light-emitting structure layer, that is, along the direction away from the substrate 10, the light-emitting structure layer sequentially includes the cathode layer, the electron transport layer, the quantum dot light-emitting structure layer, the hole transport layer and the anode layer. It is easy to be understood that the manufacturing method of the quantum dot display panel provided by the embodiments of the present disclosure are also applicable for a display panel including a forward light-emitting structure layer, that is, along the direction away from the substrate 10, the light-emitting structure layer sequentially includes the anode layer, the hole transport layer, the quantum dot light-emitting structure layer, the electron transport layer and the cathode layer.

Figure 8:
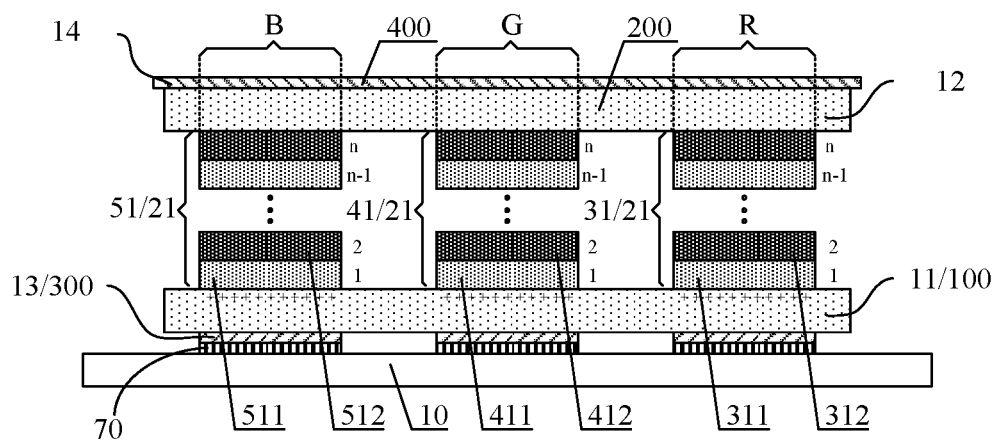
FIG. 8 is a schematic structural diagram of the display panel, which includes switch elements, manufactured according to at least one embodiment of the present disclosure.

For example, as shown in FIG. 8, the quantum dot display panel provided by at least one embodiment of the present disclosure further includes a plurality of switch elements 70 on the substrate 10, and the plurality of switch elements 70 are electrically connected to the plurality of cathode layers 13 corresponding to the plurality of quantum dot light-emitting structure layers respectively (e.g., the plurality of switch elements 70 are electrically connected to the plurality of cathode layers 13 in one-to-one correspondence), so as to control the light-emitting states of the plurality of quantum dot light-emitting structure layers via the plurality of switch elements 70, respectively.

At least one embodiment of the present disclosure provides a quantum dot display panel, which includes the substrate 10, the first functional layer 100 and the quantum dot light-emitting structure layer 21, as shown in FIGS. 3B, 4B, 5, 6, and 7. The first functional layer 100 is disposed on the substrate 10, the first functional layer 100 includes the processed region 20, and the processed region 20 includes the ions having the first polarity. The quantum dot light-emitting structure layer 21 is within the processed region 20 (that is, an orthographic projection of the quantum dot light-emitting structure layer 21 on the first functional layer 100 is located within the processed region 20) and is on the first functional layer 100 (i.e., on the side of the first functional layer 100 away from the substrate 10). The quantum dot light-emitting structure layer 21 includes the quantum dot layer 211 having the second polarity, and the second polarity and the first polarity are opposite electrical polarities.

For example, the quantum dot layer 211 having the second polarity is in direct contact with the first functional layer 100. Thus, in the process of forming the quantum dot layer 211 having the second polarity, the attraction force between the quantum dots having the second polarity and the ions having the first polarity in the processed region 20 of the first functional layer 100 is relatively strong.

For example, as shown in FIG. 2, the first functional layer 100 includes the processed region 20 and the unprocessed region 2. The unprocessed region 2 is outside of the processed region 20 and directly connected to the processed region 20 (thus, the first functional layer 100 is a one-piece structure); and the concentration of the ions having the first polarity in the processed region 20 is greater than the concentration of the ions having the first polarity in the unprocessed region 2.

For example, the quantum dot display panel includes the plurality of quantum dot light-emitting structure layers 21, and for example, the plurality of quantum dot light-emitting structure layers 21 include quantum dot light-emitting structure layers which are configured for emitting light of different colors respectively. For example, the plurality of quantum dot light-emitting structure layers 21 include the red light-emitting structure layer 31, the green light-emitting structure layer 41 and the blue light-emitting structure layer 51, as shown in FIG. 7.

For example, the quantum dot light-emitting structure layer further includes the quantum dot layer 212 having the first polarity, and the quantum dot layer 212 having the first polarity is located in the processed region 20 and is laminated on the quantum dot layer 211 having the second polarity.

For example, the quantum dot light-emitting structure layer does not exhibit a polarity as a whole. That is, the quantum dot light-emitting structure layer is electrically neutral as a whole.

For example, at least one embodiment of the present disclosure further provides a quantum dot display panel. As shown in FIGS. 5 and 6, the quantum dot display panel includes the first functional layer 100 which is on the substrate 10, the first functional layer 100 includes the processed region 20 and the processed region 20 includes the ions having the first polarity; the quantum dot display panel further includes the quantum dot light-emitting structure layer which is in the processed region 20 and is on the first functional layer 100. The quantum dot light-emitting structure layer includes n layers including quantum dot layers 211 having the second polarity and quantum dot layers 212 having the first polarity which are alternately arranged in sequence, and the quantum dot layer contacting the first functional layer 100 is the quantum dot layer 211 having the second polarity, wherein n≥3.

It should be noted that according to the above description, the quantum dot light-emitting structure layer 21 includes n quantum dot layers, and n is greater than or equal to 1. In the case where n=1, the quantum dot light-emitting structure layer 21 includes only one quantum dot layer 211 having the second polarity, as shown in FIG. 3B; in the case where n=2, the quantum dot light-emitting structure layer 21 only includes one quantum dot layer 211 having the second polarity and one quantum dot layer 212 having the first polarity, as shown in FIG. 4B; in the case where n=3, the quantum dot light-emitting structure layer 21 includes two quantum dot layers 211 having the second polarity and one quantum dot layer 212 having the first polarity which is sandwiched between the two quantum dot layers 211 having the second polarity; and so on, and details will not be described here.

For example, the display panel further includes the second functional layer 200 disposed on the quantum dot light-emitting structure layer and includes the second electrode layer 400 disposed on the second functional layer 200.

For example, the display panel further includes: the first electrode layer 300 disposed between the substrate 10 and the first functional layer 100.

For example, in the case where n≥3, the quantum dot light-emitting structure layer does not exhibit a polarity as a whole.

In at least one embodiment of the present disclosure, for example, the first polarity includes include one of the positive polarity and the negative polarity, and the second polarity includes the other of the positive polarity and the negative polarity. The first electrode layer for example include one of the anode layer and the cathode layer, and the second electrode layer for example include the other of the anode layer and the cathode layer. The first functional layer for example include one of the electron transport layer and the hole transport layer, and the second functional layer for example include the other of the electron transport layer and the hole transport layer.

For example, in at least one embodiment, the first polarity is the positive polarity, the second polarity is the negative polarity, and the second polarity is opposite to the first polarity in electric polarity. The first electrode layer is for example the anode layer and the second electrode layer is for example the cathode layer. The first functional layer is for example the electron transport layer and the second functional layer is for example the hole transport layer.

It should be noted that the arrangement manner of each structure in the embodiments of the quantum dot display panel can adopt the arrangement manner of the same component in the manufacturing method described above, and details will not be repeated.

Based on the inventive concept of the above embodiments, at least one embodiment of the present disclosure further provides a display device, which includes the quantum dot display panel provide by any one of the above embodiments.

For example, the display device can be any product or component having a display function, such as a mobile phone, a tablet computer, a television, a display, a notebook computer, a digital photo frame, a navigator, etc.

At least one embodiment of the present disclosure further provides a manufacturing method of a quantum dot display panel. Taking the quantum dot display panel shown in FIG. 9 as an example, the manufacturing method includes: providing a driving substrate 10A which includes the substrate 10 and the first electrode layer 300 on the substrate 10; applying an electrical signal to the first electrode layer 300 so that a region which is included by the driving substrate 10A and which is provided with the first electrode layer 300 exhibits the first polarity; forming the quantum dot layer 211 having the second polarity on the side of the first electrode layer 300 away from the substrate 10. The second polarity and the first polarity are opposite electrical polarities. In the embodiments of the present disclosure, by applying the electrical signal to the first electrode layer 300, the region which is included by the driving substrate 10A and which is provided with the first electrode layer 300 exhibits the first polarity as a whole; in the case where the material for forming the quantum dot layer 211 is formed on the driving substrate 10A and then is washed, the quantum dots having the second polarity in the material is retained due to being attracted by the region of the driving substrate 10A, so as to form the quantum dot layer 211 having the second polarity.

For example, the quantum dot display panel includes the quantum dot light-emitting structure layer 21 on the driving substrate 10A, and the quantum dot light-emitting structure layer 21 includes the quantum dot layer 211 having the second polarity.

For example, the manufacturing method provided by at least one embodiment of the present disclosure further includes: forming the quantum dot layer 212 having the first polarity on the quantum dot layer 211 having the second polarity. The quantum dot light-emitting structure layer 21 includes the quantum dot layer 211 having the second polarity and the quantum dot layer 212 having the first polarity. The orthographic projection of the quantum dot layer 212 having the first polarity on the substrate 10 is located within the orthographic projection of the quantum dot layer 211 having the second polarity on the substrate 10 (e.g., the orthographic projections of them substantially coincide with each other), and the quantum dot layer 212 having the first polarity is on the side of the quantum dot layer 211 having the second polarity away from substrate 10.

For example, the quantum dot layer 212 having the first polarity is in direct contact with the quantum dot layer 211 having the second polarity, so as to improve the attraction force between the quantum dots having the first polarity in the material for forming the quantum dot layer 212 having the first polarity and the quantum dots having the second polarity in the material for forming the quantum dot layer 211 having the second polarity.

For example, the quantum dot light-emitting structure layer 21 includes n quantum dot layers, and n is greater than or equal to 1. In the case where n=1, the quantum dot light-emitting structure layer 21 includes only one quantum dot layer 211 having the second polarity; in the case where n=2, the quantum dot light-emitting structure layer 21 only includes one quantum dot layer 211 having the second polarity and one quantum dot layer 212 having the first polarity; in the case where n=3, the quantum dot light-emitting structure layer 21 includes two quantum dot layers 211 having the second polarity and one quantum dot layer 212 having the first polarity which is sandwiched between the two quantum dot layers 211 having the second polarity; and so on, and details will not be described here.

For example, the manufacturing method provided by at least one embodiment of the present disclosure further includes: electrically neutralizing the quantum dot light-emitting structure layer 21 so that the quantum dot light-emitting structure layer 21 does not exhibit a polarity outwards.

For example, the quantum dot display panel includes a plurality of quantum dot light-emitting structure layers 21 which are on the driving substrate 10A and spaced apart. In this case, the driving substrate 10A includes a plurality of first electrode layers 300 which are spaced apart, and the plurality of quantum dot light-emitting structure layers 21 correspond to (e.g., in one-to-one correspondence) the plurality of first electrode layers 300, respectively. For example, the plurality of quantum dot light-emitting structure layers 21 include quantum dot light-emitting structure layers for emitting light of different colors respectively. For example, the plurality of quantum dot light-emitting structure layers 21 include the red light-emitting structure layer 31, the green light-emitting structure layer 41, and the blue light-emitting structure layer 51.

For example, in the case where the quantum dot light-emitting display panel includes the plurality of quantum dot light-emitting structure layers 21, the driving substrate 10A includes a plurality of switch elements 70 on the substrate 10, and the plurality of switch elements 70 are electrically connected to the plurality of first electrode layers 300 corresponding to the plurality of quantum dot light-emitting structure layers 21 respectively (e.g., the plurality of switch elements 70 are electrically connected to the plurality of first electrode layers 300 in one-to-one correspondence), so as to control the light-emitting states of the plurality of quantum dot light-emitting structure layers 21 via the plurality of switch elements 70, respectively.

Figure 9:
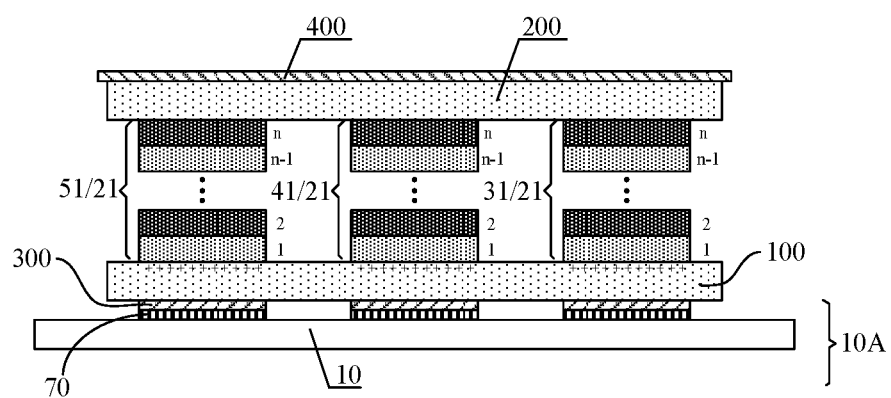
FIG. 9 is a schematic structural diagram of the display panel manufactured according to at least another embodiment of the present disclosure.

For example, as shown in FIG. 9, the driving substrate 10A further includes the switch elements 70 on the substrate 10, and the switch elements 70 are electrically connected to the first electrode layers 300 respectively, so as to apply electrical signals to the first electrode layers 300. For example, the switch elements are transistor or switches of other types, without being limited in the embodiments of the present disclosure.

The manufacturing method provided by at least one embodiment of the present disclosure further includes: forming the second electrode layer 400 on the side of the quantum dot light-emitting structure layer 21 away from the substrate 10. One of the first electrode layer 300 and the second electrode layer 400 is an anode layer, and the other of the first electrode layer 300 and the second electrode layer 400 is a cathode layer.

For example, the manufacturing method provided by at least one embodiment of the present disclosure further includes: forming the first functional layer 100 between the quantum dot light-emitting structure layer 21 and the first electrode layer 300, and forming the second functional layer 200 between the quantum dot light-emitting structure layer 21 and the second electrode layer 400. One of the first functional layer 100 and the second functional layer 200 is an electron transport layer, and the other of the first functional layer 100 and the second functional layer 200 is a hole transport layer.

For example, the first electrode layer 300 is a cathode layer, the first functional layer 100 is an electron transport layer, the second electrode layer 400 is an anode layer, and the second functional layer 200 is a hole transport layer; alternatively, the first electrode layer 300 is an anode layer, the first functional layer 100 is a hole transport layer, the second electrode layer 400 is a cathode layer, and the second functional layer 200 is an electron transport layer. That is, the manufacturing method includes: forming the electron transport layer between the quantum dot light-emitting structure layer 21 and the cathode layer, and forming the hole transport layer between the quantum dot light-emitting structure layer 21 and the anode layer.

For example, in the case where the plurality of quantum dot light-emitting structure layers 21 are included, the plurality of first electrode layers 300 corresponding to the plurality of quantum dot light-emitting structure layers 21 are disconnected from each other; furthermore, the plurality of quantum dot light-emitting structure layers for example share the second electrode layer 400, and/or share the first functional layer 100, and/or share the second functional layer 200. By sharing a same layer, the manufacturing process can be simplified. In other embodiments, at least one selected from the group consisting of the second electrode layer 400, the first functional layer 100 and the second functional layer 200, may be not shared.

It should be noted that the manufacturing method and arrangement manner of each structure in the manufacturing method shown in FIG. 9 can respectively adopt the manufacturing method and arrangement manner of the same structure in the manufacturing method provided by any one of the above embodiments, and details will not repeated here.

In summary, in at least one embodiment of the present disclosure, the first functional layer is made to include the processed region which includes the ions having the first polarity or the region which is included by the driving substrate and which is provided with the first electrode layer is made to exhibit the first polarity, so that the quantum dot layer having the second polarity is formed in the processed region by utilizing the mutual attraction of the first polarity and the second polarity, thereby forming the pattern of the quantum dot light-emitting structure layer. The manufacturing method of the quantum dot display panel is easy to realize accurate control of the processed region, so that the shape and position of the pattern of the quantum dot light-emitting structure layer can be accurately controlled, the patterning of the quantum dot light-emitting structure layer can be realized, the accuracy of the pattern can be ensured, and the display quality of the quantum dot display panel can be ensured.

What are described above is related to the illustrative embodiments of the disclosure only and not limitative to the scope of the disclosure; the scopes of the disclosure are defined by the accompanying claims.

What is claimed is:

1. A manufacturing method of a quantum dot display panel, comprising:
   forming a first functional layer on a substrate;
   processing the first functional layer by applying an electrical signal so that the first functional layer comprises a processed region and the processed region comprises ions having a first polarity; and
   forming a quantum dot layer having a second polarity in the processed region, wherein the second polarity and the first polarity are opposite electrical polarities.

2. The manufacturing method according to claim 1, wherein the processed region is corresponding to a region to be processed before the processing the first functional layer, and a concentration of the ions having the first polarity in the processed region is greater than a concentration of the ions having the first polarity in the region to be processed.

3. The manufacturing method according to claim 1, wherein
   by the processing the first functional layer, the first functional layer comprises the processed region and an unprocessed region, and the unprocessed region is outside of the processed region; and
   a concentration of the ions having the first polarity in the processed region is greater than a concentration of the ions having the first polarity in the unprocessed region.

4. The manufacturing method according to claim 1, wherein a material of the first functional layer comprises a photodegradable substance, and further comprises at least one selected from the group consisting of nanoparticles and a bulk material.

5. The manufacturing method according to claim 4, wherein the least one selected from the group consisting of the nanoparticles and the bulk material is configured to react with a substance produced by the photodegradable substance after the processing the first functional layer, so as to form the ions having the first polarity.

6. The manufacturing method according to claim 1, wherein the processing the first functional layer so that the first functional layer comprises the processed region, comprises:
   irradiating the first functional layer with ultraviolet light so that a region which is irradiated by the ultraviolet light and which is comprised by the first functional layer forms the processed region.

7. The manufacturing method according to claim 1, wherein the forming the quantum dot layer having the second polarity in the processed region, comprises:
   forming a quantum dot film having the second polarity on the first functional layer; and
   by washing the quantum dot film having the second polarity, removing quantum dots having the second polarity which are in the quantum dot film having the second polarity and which are outside of the processed region, to form the quantum dot layer having the second polarity in the processed region.

8. The manufacturing method according to claim 1, further comprising:
   forming a quantum dot layer having the first polarity on the quantum dot layer having the second polarity, wherein an orthographic projection of the quantum dot layer having the first polarity on the first functional layer is in the processed region, and the quantum dot layer having the first polarity is on a side of the quantum dot layer having the second polarity away from the first functional layer.

9. The manufacturing method according to claim 8, wherein the forming the quantum dot layer having the first polarity on the quantum dot layer having the second polarity, comprises:

forming a quantum dot film having the first polarity on the quantum dot layer having the second polarity; and by washing the quantum dot film having the first polarity, removing quantum dots having the first polarity which are in the quantum dot film having the first polarity and which are outside of the processed region, so as to form the quantum dot layer having the first polarity in the processed region.

10. The manufacturing method according to claim 8, wherein
the quantum dot display panel comprises a quantum dot light-emitting structure layer on a side of the first functional layer away from the substrate, the quantum dot light-emitting structure layer comprises the quantum dot layer having the second polarity and the quantum dot layer having the first polarity, and
the manufacturing method further comprises: electrically neutralizing the quantum dot light-emitting structure layer so that the quantum dot light-emitting structure layer does not exhibit a polarity as a whole.

11. The manufacturing method according to claim 10, further comprising:
forming a first electrode layer, a second electrode layer and a second functional layer on the substrate, wherein the first functional layer is on a side of the first electrode layer away from the substrate, the second functional layer is on a side of the quantum dot light-emitting structure layer away from the substrate, and the second electrode layer is on a side of the second functional layer away from the substrate.

12. The manufacturing method according to claim 11, wherein
the first electrode layer is a cathode layer, the first functional layer is an electron transport layer, the second functional layer is a hole transport layer, and the second electrode layer is an anode layer; or
the first electrode layer is the anode layer, the first functional layer is the hole transport layer, the second functional layer is the electron transport layer, and the second electrode layer is the cathode layer.

13. The manufacturing method according to claim 1, wherein the first functional layer comprises an electron transport layer, and
the manufacturing method further comprises: forming a cathode layer on the substrate before the forming the first functional layer on the substrate.

14. The manufacturing method according to claim 1, wherein the quantum dot layer having the second polarity is in direct contact with the first functional layer.

15. A manufacturing method of a quantum dot display panel, comprising:
providing a driving substrate, wherein the driving substrate comprises a substrate and a first electrode layer on the substrate;
applying an electrical signal to the first electrode layer so that a region which is comprised by the driving substrate and which is provided with the first electrode layer exhibits a first polarity; and
forming a quantum dot layer having a second polarity on a side of the first electrode layer away from the substrate, wherein the second polarity and the first polarity are opposite electrical polarities.

16. The manufacturing method according to claim 15, wherein the driving substrate further comprises a switch element on the substrate, and the switch element is electrically connected to the first electrode layer to apply the electrical signal to the first electrode layer.

17. A quantum dot display panel, comprising:
a substrate;
a first functional layer on the substrate, wherein the first functional layer comprises a processed region, and the first functional layer comprises ions having a first polarity in the processed region; and
a quantum dot light-emitting structure layer on a side of the first functional layer away from the substrate, wherein an orthographic projection of the quantum dot light-emitting structure layer on the first functional layer is located in the processed region, the quantum dot light-emitting structure layer comprises a quantum dot layer having a second polarity, and the second polarity and the first polarity are opposite electrical polarities.

18. The quantum dot display panel according to claim 17, wherein
the first functional layer comprises the processed region and an unprocessed region, and the unprocessed region is outside of the processed region; and
a concentration of the ions having the first polarity in the processed region is greater than a concentration of the ions having the first polarity in the unprocessed region.

19. The quantum dot display panel according to claim 17, wherein a material of the first functional layer comprises a photodegradable substance, and further comprises at least one selected from the group consisting of nanoparticles and a bulk material, and the first polarity is a positive polarity.

20. A display device, comprising the quantum dot display panel according to claim 17.

* * * * *